United States Patent [19]
Teramoto

[11] Patent Number: 5,508,532
[45] Date of Patent: Apr. 16, 1996

[54] SEMICONDUCTOR DEVICE WITH BRADED SILICON NITRIDE

[75] Inventor: Satoshi Teramoto, Kanagawa, Japan

[73] Assignee: Semiconductor Energy Laboratory Co., Ltd., Kanagawa, Japan

[21] Appl. No.: 261,920

[22] Filed: Jun. 16, 1994

[51] Int. Cl.⁶ .......................... H01L 29/04; H01L 31/036; H01L 31/0376; H01L 31/20
[52] U.S. Cl. .............. 257/59; 257/410; 257/411; 257/347; 359/59
[58] Field of Search ................................ 257/410, 411, 257/59, 72, 347; 359/59

[56] References Cited

U.S. PATENT DOCUMENTS 4,416,952  11/1983  Nishizawa et al. ............... 257/411
4,868,632   9/1989  Hayashi et al. ................... 257/411

FOREIGN PATENT DOCUMENTS 4-044274   2/1992  Japan ............................. 257/411
5-343694  12/1993  Japan ............................. 257/411

Primary Examiner—William Mintel
Attorney, Agent, or Firm—Sixbey, Friedman, Leedom & Ferguson; Gerald J. Ferguson

[57] ABSTRACT

A gate insulating film covering active layers of a insulated gate field effect semiconductor device utilizing a thin film silicon semiconductor comprises a thin film having the chemical formula $SiO_xN_y$. By making the concentration of N (nitrogen) high at the interface between the gate insulating film and the gate electrodes, it is possible to prevent the material composing the gate electrodes from being diffused in the gate insulating film. By making the concentration of N (nitrogen) high at the interface between the gate insulating film and the active layers, it is possible to prevent hydrogen ions and other ions from diffusing into the gate insulating film from the active layer.

18 Claims, 5 Drawing Sheets

SEMICONDUCTOR DEVICE WITH BRADED SILICON NITRIDE

FIELD FOR INDUSTRIAL USE

The present invention relates to a structure and method of fabricating an insulated gate field effect semiconductor device utilizing a thin film semiconductor formed on an insulating substrate (generally referred to as a thin film transistor or a TFT).

BACKGROUND OF THE INVENTION

Conventionally, an insulated gate field effect semiconductor device utilizing a thin film semiconductor (hereinafter referred to as a TFT) formed on an insulating substrate (especially a glass substrate) has been known. Such a TFT formed on an insulating substrate is utilized for devices such as liquid crystal displays and image sensors.

It is conventional that silicon oxide ($SiO_2$) is utilized for a gate insulating film of the TFT mentioned above. It is desirable to utilize a crystalline silicon film as an active layer of the TFT so as to obtain excellent operating characteristics. Various methods can be used to form the crystalline silicon film, such as directly depositing a silicon film with a micro-crystalline structure by low pressure thermal CVD (chemical vapor deposition) and the like, or crystallizing an amorphous silicon film by a heating treatment or irradiating with laser light and the like.

In either case, it is impossible to obtain a single-crystalline structure at this stage. That is, a structure of a crystalline silicon film to be obtained is a polycrystalline structure, a microcrystalline structure, a mixed condition of a crystalline structure and an amorphous structure, or a structure including a crystalline structure.

In such a crystalline structure mentioned above, numerous dangling bonds of silicon exist, and therefore it is necessary that an active layer contain hydrogen to neutralize (i.e. terminate) the dangling bonds. That is, it is necessary to hydrogenize the active layer. On the other hand, it is imperative to prevent hydrogen from being included in the gate insulating film. That is, movable ions, such as hydrogen, existing in the gate insulating film during operation of a TFT cause hysteresis, or cause a variation in a threshold voltage value.

In the case of forming a conventional TFT on a glass substrate, the entire device tends to be charged with static electricity. Thus there is a problem that breakdown of the gate insulating film occurs due to the static electricity. That is, the charged static electricity generates a high voltage across the gate insulating film, and the gate insulating film cannot bear this voltage.

It is assumed that the above mentioned problem occurs because the energy band gap (Eg) of a silicon oxide ($SiO_2$) film is as much as approximately 8 eV and the dielectric constant thereof is relatively small —approximately 3.8.

It can be considered to utilize a silicon nitride ($Si_3N_4$) film with an Eg of approximately 5 eV and the dielectric constant of approximately 7 as a gate insulating film, instead of utilizing a silicon oxide film. However, if a silicon nitride film is utilized as a gate insulating film, hysteresis occurs to C-V (capacitance-voltage) characteristics, because Si clusters become charge trapping centers. Furthermore, there is a problem that the threshold voltage ($\Delta V_{th}$) shifts about 10 V during a B-T (bias-temperature) treatment. That is, if silicon nitride is utilized as a gate insulating film, then charge trapping centers exist in the insulating film and therefore, this film is not preferable as an insulating film.

The invention disclosed herein is directed to:

(1) providing a gate insulating film in which breakdown caused by static electricity is reduced or eliminated, and (2) providing a gate insulating film in which the existence of charge trapping centers is reduced or eliminated.

It is desirable to include hydrogen in an active layer. However, when hydrogen is included in the active layer, there is a problem that hydrogen is diffused from the active layer into the neighboring gate insulating film. This, however, is inconsistent with the requirement that hydrogen should not be included in the gate insulating film contacting the active layer. Therefore, the present invention further provides a gate insulating film to which ions in the active layer will not be diffused.

Also, when a material mainly comprising metal is utilized as a gate electrode, this metal material and the semiconductor component composing the gate insulating film undesirably form an alloy with each other. The invention disclosed herein is further directed at providing a structure wherein a metal component of the gate electrode is not diffused from the gate electrode into the gate insulating film.

SUMMARY OF THE INVENTION

One embodiment of the invention disclosed in this specification is directed to an insulated gate field effect semiconductor device in which the gate insulating film comprises a material represented by the chemical formula $SiO_xN_y$, and the concentration (or composition ratio) of nitrogen (N) in the material is varied in a thickness direction of the film. Also, it is especially beneficial to form a TFT having the above mentioned structure on an insulating substrate so as to prevent breakdown due to static electricity.

The present invention is further characterized in that the gate insulating film comprising the $SiO_xN_y$ material discussed above further includes chlorine (Cl). The present invention is also characterized in that when forming the $SiO_xN_y$ material added with chlorine, a gas phase method utilizing chlorine or dichlorosilane as a material gas is utilized to add the chlorine to the film.

The $SiO_xN_y$ material has an energy band gap of 5.3 to 7.0 eV, a dielectric constant of 4 to 6, and the stoichiometric amounts x and y satisfy the relations of: $0<x<2$ and $0<y<4/3$. The stoichiometric amounts x and y can be changed according to formation conditions, and can be set up according to usage conditions. In the most preferred embodiment, oxygen (O) is contained at 1 atomic percent or more, and preferably 10 atomic percent or more, and N is contained at 0.001 atomic percent or more, preferably 0.1 atomic percent or more.

As a method of forming the material represented as $SiO_xN_y$, vapor phase methods such as a plasma chemical vapor deposition (PCVD) method (13.56 MHz), a low pressure chemical vapor deposition (LPCVD) method, a photo CVD method, a PCVD method applying pulse waves and the like can be utilized. Of course, it is further possible to intentionally dope other halogen elements or impurities into the $SiO_xN_y$ insulating film if necessary.

Another embodiment of the invention disclosed in this specification is characterized in that a gate insulating film comprises a thin film having a chemical formula of $SiO_xN_y$, and the composition ratio of N (nitrogen) is maximum in the interface of a gate electrode and/or an active layer.

FIG. 4 to FIG. 6 further illustrate the above configuration where the concentration of N (nitrogen) in the $SiO_xN_y$ thin film in the interface of a gate electrode and/or an active layer is maximum. Specifically, FIG. 4 to FIG. 6 show the relationship between concentration (vertical axis) of N (nitrogen) and a site of a gate insulating film through thickness.

FIG. 4 shows an example when the concentration of N is the highest in the interface between the gate insulating film and the active layer. FIG. 5 shows an example when concentration of N is made the highest in the interface between the gate insulating film and the gate electrode. FIG. 6 shows an example when concentration of N is the highest in both the interface between the gate insulating film and the active layer, and the interface between the gate insulating film and the gate electrode. Here, the term "highest" means that the concentration is relatively the highest with respect to other portions of the film.

In the case where metal elements for accelerating crystallization of silicon are included in an active layer, it is possible to prevent these metal elements from being diffused from the active layer to the gate insulating film by making the concentration of N the highest at the interface between the gate insulating film and the active layer. By increasing the concentration of N, a barrier layer utilizing Si—N bondings can be formed.

It is desirable that the metal elements mentioned above for accelerating crystallization of silicon are those that can be readily diffused into silicon. For example, as these metal elements, one or more elements selected from the group consisting of Ni, Fe, Co, Ru Pd, Os, Ir, Pt, Cu, Ag and Au can be utilized.

The metal elements specified above are diffused in a silicon film in a heat treatment process. As the elements are diffused, crystallization of silicon proceeds. That is, as the elements are diffused, they accelerate the crystallization of an amorphous silicon film by a catalytic effect.

Since these elements are quickly diffused throughout the silicon film, the concentration (i.e. introduction or addition amount) of them is important. That is, if the concentration of these elements is small, the effect of accelerating crystallization is small, and appropriate crystal characteristics cannot be obtained. If the concentration of the elements is too large, however, then the semiconductor characteristics of the silicon will be impaired.

Therefore, the optimum amount of the metal element to be introduced into an amorphous silicon film is important. For example, in the case of utilizing Ni (nickel) as a metal element to accelerate the crystallization, crystallization can be accelerated by controlling the concentration of Ni introduced to the amorphous silicon film to $1\times10^{15}$ $cm^{-3}$ or more. It has been noticed that semiconductor characteristics are not impaired if the concentration of Ni is controlled so that the concentration of Ni in the crystallized silicon film is $1\times10^{19}$ $cm^{-3}$ or less. Concentration here may be defined, for example, by a minimum value obtained by SIMS (secondary ion mass spectroscopy). Of course, metal elements other than Ni used in the above example can accelerate the crystallization when introduced in a concentration range similar to that of Ni.

Crystallization of the amorphous silicon film can also be accelerated in the case of utilizing Al or Sn in place of the metal elements above mentioned. However, Al or Sn will form an alloy with silicon, and will not be diffused into the silicon film. In this case, crystal growth will only start from the portion to which Al or Sn has been introduced (that is, the alloyed layers of these elements and silicon), and the crystal characteristic or structure is generally inferior to that obtained in the case of utilizing the elements which diffuse into the silicon, like Ni. Furthermore, there are other problems in that the alloyed layers interfere with the device formation process, and that existence of the alloyed layers lowers the reliability of the device.

In the present invention, the energy band gap, or Eg, of $SiO_xN_y$ is 5.3 to 7.0 Eg, and the dielectric constant ranges from 4 to 6. Thus Fowler-Nordheim current (tunnel current through an insulating film) can flow at approximately ten times the rate as with a silicon oxide film, and thus electrostatic discharge damage is prevented. Furthermore, oxygen is included in the $SiO_xN_y$ gate insulating film, and this oxygen causes a loss of hysteresis. N (SiN bonding) prevents drift of Na and heavy metal (Fe, Ni, or Co) ions. Also, because chlorine (Cl) has been added, Na ions and Fe ions can be neutralized (i.e. fixed). Furthermore, adverse effects caused by impurity ions in the gate insulating film can be prevented.

By changing the concentration of N throughout the thickness of the $SiO_xN_y$ gate insulating film, a barrier layer can be formed at an arbitrary depth in the gate insulating layer. Specifically, by making the composition ratio of N the highest in a boundary between the $SiO_xN_y$ gate insulating film and the active layer, a barrier layer can be formed there to prevent hydrogen ions or metal ions diffused from the active layer from penetrating into the gate insulating film.

Also, by making the composition ratio of N the maximum in the boundary between the $SiO_xN_y$ gate insulating film and the gate electrode, a barrier layer can be formed in this portion. Using this barrier layer, it is possible to prevent a material composing the gate electrode and diffusing from the gate electrode from penetrating into the gate insulating film.

DETAILED DESCRIPTION OF THE PREFERRED EMBODIMENT

EMBODIMENT 1

Figure 1A:
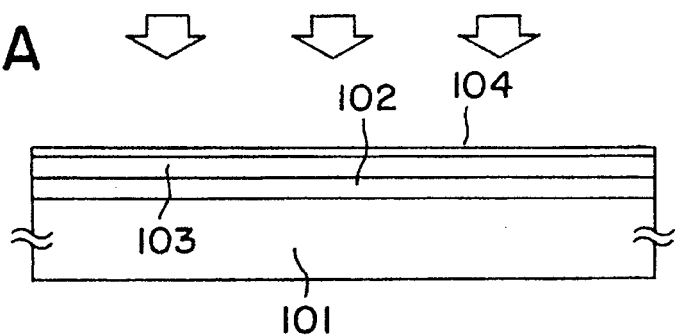
FIGS. 1A to 1E illustrate a manufacturing process of a TFT in accordance with a first embodiment of the present invention.
Figure 1B:
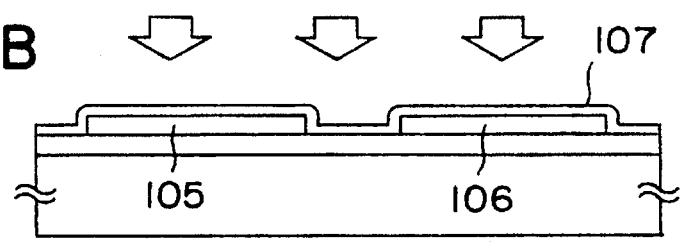

An example of forming TFTs by utilizing the present invention is shown in FIG. 1. First, a silicon oxide film having a thickness of 1000 to 3000 Å is formed on a glass substrate 101 (Corning 7059, 300 mm×300 mm or 100 mm×100 mm) as a base oxide film 102. Chlorine is added to this silicon oxide film so that effects caused by movable ions such as Na or heavy metals can be suppressed.

A sputtering method in an oxygen atmosphere or a method of annealing a film decomposed—deposited by Tetraethyl oxysilicate (TEOS) by a plasma CVD method at 450° to 650° C. can be employed for forming this oxide film. Chlorine can be added in the atmosphere or can be added to the target if a sputtering method is utilized.

Next, an amorphous silicon film 103 is deposited having a thickness of 300 to 1500 Å, preferably a 500 to 1000 Å thickness by a plasma CVD method or an LPCVD method. This amorphous silicon film 103 will be an active layer comprising a source region, a channel formation region, and a drain region.

Here, to form a TFT utilizing an amorphous silicon film, a gate insulating film should be formed on this amorphous silicon film 103. In the case where a crystalline silicon film is utilized, crystallization should be performed by thermal annealing (it is preferable if it is performed at 600° C. or lower) or by irradiation of laser light. Besides, it is effective to provide a protection film 104 like a silicon oxide film to prevent contamination of the silicon film.

The silicon film 103, which is to be used as an active layer is patterned, and active layers 105 and 106 are formed. A $SiO_xN_y$ film 107, which is to be a gate insulating film, is formed having a 200 to 1500 Å thickness, covering these active layers 105 and 106. The dielectric constant of the $SiO_xN_y$ film is 4 to 6, which is larger than the dielectric constant of 3.8 of a silicon oxide film by approximately 50%. Thus the thickness of the $SiO_xN_y$ film can be greater than that of the silicon oxide film by 50% and still obtain the same electric conditions. The thicker gate insulating film having the same electric conditions is advantageous for solving the problem of a dielectric strength (when the same voltage is applied, the electric field is weaker in the thicker film), and moreover, for solving the problem of current leakage by way of pin holes in the gate insulating film.

A PCVD method utilizing chlorosilane or dichlorosilane as a material gas is utilized as a formation method. As the formation condition, the substrate is maintained at 300° to 600° C., and a high frequency of 13.56 MHz is utilized as the high frequency energy to be applied. A glass substrate represented by Corning 7059 has a glass transition temperature of generally 600° to 900° C., so a process temperature not higher than 600° C. is preferable.

For example, when dichlorosilane ($SiH_2Cl_2$) is utilized as a material gas, and if ammonia ($NH_3$) and nitrogen monoxide ($N_2O$) are utilized as a reaction gas in addition to the dichlorosilane, then $SiO_xN_y$, HCl and $H_2O$ are generated as a result of the gas phase reaction, and a $SiO_xN_y$ film added with Cl (chlorine) is obtained. When chlorosilane is utilized as a material gas, Cl can be added to the film in the same way. As a method of forming the $SiO_xN_y$ film 107, a PCVD method in which the applied voltage is pulsed, or furthermore, a LPCVD method, or a photo CVD method can also be utilized.

Next, if desirable, annealing in a hydrogen atmosphere at 350° C. for two hours can be performed to improve the active layer 105 and the interface between the active layer 105 and the gate insulating film 107.

Figure 1C:
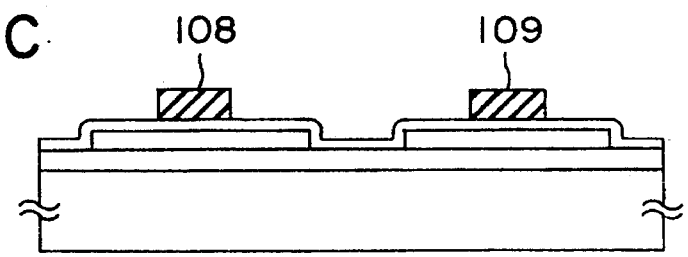

An aluminum film of having a thickness of 2000 Å to 5 μm is then formed by an electron beam evaporation method, and patterned to form gate electrodes 108 and 109 as shown in FIG. 1(C).

Next, an impurity of one conductivity type is implanted to the islandish silicon films of each TFT in a self-alignment manner, with the gate electrode portion used as a mask. Here, phosphorous is first implanted to the whole surface with phosphine ($PH_3$) as a doping gas. After that, only the island region 105 is covered with a photoresist, and boron is implanted only to the island region 106 with diborane ($B_2H_6$) as a doping gas. The dose of phosphorous is 2 to $8\times10^{15}$ $cm^{-2}$, and that of boron is 4 to $10\times10^{15}$ $cm^2$. The doping process is such that the dose of boron is more than that of phosphorous.

Figure 1D:
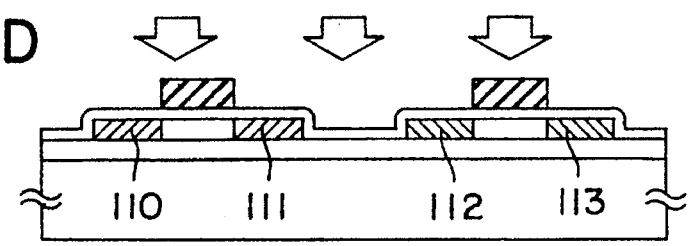

As is shown in FIG. 1(D), a KrF excimer laser (wavelength 248 nm, pulse width 20 nsec) is irradiated in order to improve the crystallinity, which is lowered due to the above impurity introduction and at the same time to activate the introduced impurity. Energy density of the laser is 200 to 400 $mJ/cm^2$, preferably 250 to 300 $mJ/cm^2$.

In this way, N-type impurity regions are formed in regions 110 and 111, and P-type impurity regions are formed in regions 112 and 113. Sheet resistance of these regions is 200 to 800 $\Omega/cm^2$.

Next, a silicon oxide film is formed having a thickness of approximately 3000 Å as an interlayer insulator 114 on the entire surface utilizing TEOS as a material, through a plasma CVD method with TEOS and oxygen or through a low pressure CVD method or a normal pressure CVD method with TEOS and ozone. The temperature of the substrate is 150° to 400° C., preferably 200° to 300° C.

Figure 1E:
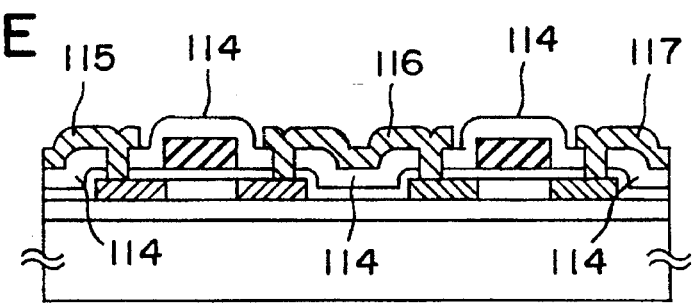

Contact holes are then formed in the source/drain of the TFTs, and aluminum interconnections 115 to 117 are formed. FIG. 1(E) shows an invertor circuit comprising an NTFT (N-channel thin film transistor) on the left side and a PTFT (P-channel film transistor) on the fight side.

When the silicon film 103 is crystallized by thermal annealing, mobility of the TFTs is 50 to 100 $cm^2/Vs$ for the NTFT, and 30 to 100 $cm^2/Vs$ for the PTFT. Since the highest process temperature is 600° C. or less throughout this embodiment, there is no shrinkage or warp of the substrate if the substrate is non-alkali glass like Corning 7059. Therefore, even if the substrate is large like that of this embodiment, dislocation of a pattern hardly occurs. Accordingly, this embodiment is convenient for application to large-scale displays or driving circuits thereof.

EMBODIMENT

FIG. 2 illustrates the manufacturing method of this embodiment. This embodiment is an example of manufacturing a TFT utilized for driving pixels of an active matrix type liquid crystal display device.

A Corning 7059 glass substrate (1.1 mm thickness, 300× 400 mm) is utilized as a substrate 201. A silicon nitride film 202 of 50 to 500 Å thickness, preferably 50 to 200 Å thickness is formed on the entire surface of this glass substrate by a plasma CVD method so that impurities like sodium (Na) from the glass substrate will not be diffused into a TFT.

First, a base oxide film 203 (silicon oxide) is formed on the glass substrate mentioned above. After that, an amorphous silicon film 204 (thickness is 300 to 1500 Å, preferably 300 to 500 Å) is formed by an LPCVD method or a plasma CVD method. After dehydrogenation is performed for an hour at 400° C., this is patterned and an island semiconductor region (an active layer of a TFT) 204 is formed.

By the same method as in Embodiment 1, a $SiO_xN_y$ film is formed as a gate insulating film 205. Before forming the gate insulating film, the amorphous silicon film 204 can be crystallized to form crystalline silicon (i.e. a silicon film having crystallinity such as micro-crystalline, poly-crystalline, poly-silicon, or semiamorphous) by irradiation of laser light or thermal annealing.

Figure 2A:
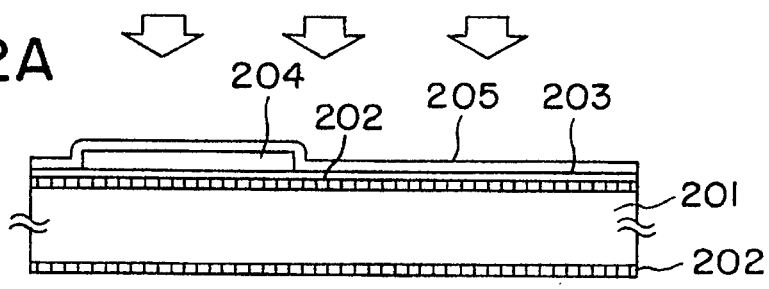
FIGS. 2A to 2E illustrate a manufacturing process of a TFT in accordance with a second embodiment of the present invention.
Figure 2B:
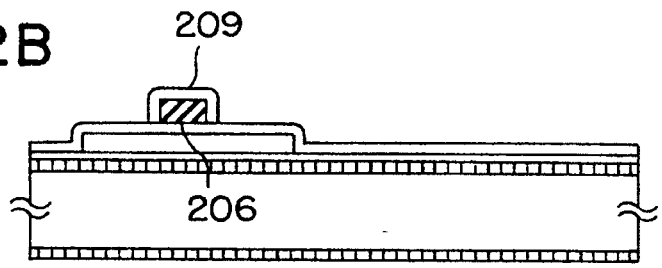

A gate electrode 206 of aluminum is formed in the same manner as in Embodiment 1. The gate electrode with the substrate is dipped in an electrolyte. A current is applied through the gate electrode with this gate electrode as an anode. Thus, a film 209 of anodic oxide is formed on the surface of the aluminum interconnections such as the gate electrode. Technology of anodic oxidation suitable for use in the present invention is discussed in Japanese patent applications 4-30220, 4-38637, and 4-54322 filed by the present inventor. The state of the device after this process is finished is shown in FIG. 2(B).

On the other hand, negative voltage such as −100 to −200 V can be applied for 0.1 to 5 hours after the anodic oxidation process is finished. It is desirable that the temperature of the substrate is 100° to 250° C., typically 150° C. By this process, movable ions existing in the silicon oxide or in the interface between the silicon oxide and the silicon are drawn to the gate electrode (Al). The technology of applying a negative voltage to the gate electrode after or during anodic oxidation is disclosed in Japanese patent application 4-115503 (filed on Apr. 7, 1992) by the present inventor.

An oxide film 207 on the side of the gate electrode 206 functions as a mask in a process of ion implantation later. Thus an offset gate structure can be formed.

Figure 2C:
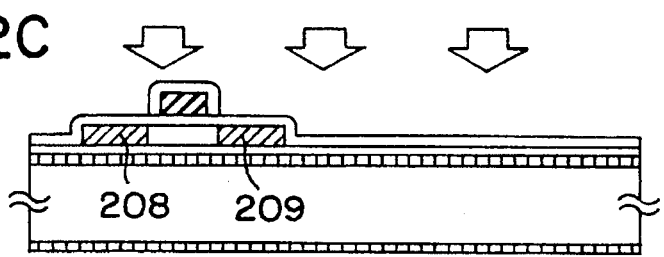
Figure 2D:
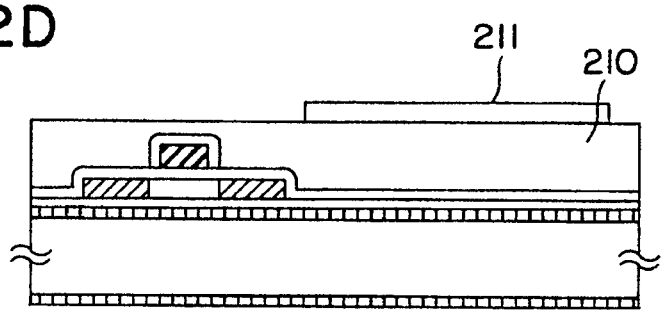
Figure 2E:
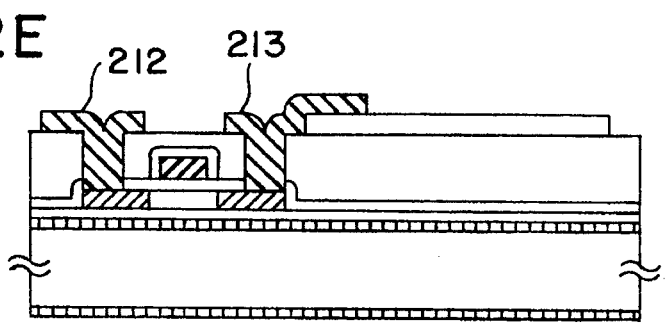

Next, boron is implanted as a P-type impurity to an active layer 204 in a self-alignment manner by an ion doping method to form source/drain regions 208 and 207 of a TFT. Further, as is shown in FIG. 2(C), KrF excimer laser light is irradiated, and the crystal character of the silicon film which has been impaired by this ion doping is improved. Here, the energy density of the laser light is fixed at 250 to 300 mJ/cm². By this laser irradiation, sheet resistance of the source/drain of this TFT becomes 300 to 800 Ω/cm². At the same time, by the effect of the oxide film 207, an offset gate structure is formed in a self-alignment manner.

Next, an interlayer insulator 210 is formed of polyimide, and a pixel 211 is formed of ITO (indium tin oxide). A contact hole is formed, and electrodes 212 and 213 are formed from chromium/aluminum multi-layer in the source/drain regions of the TFT. One of these electrodes 213 is made to connect the ITO, also. The chrome/aluminum multilayer comprises a chromium film of 200 to 2000 Å thickness, typically 1000 Å thickness as the lower layer, and an aluminum film of 1000 to 20000 Å thickness, typically 5000 Å thickness as the upper layer. It is desirable these layers are formed in continuation by a sputtering method.

This substrate is then annealed for two hours in hydrogen at 200° to 300° C., and hydrogenization of silicon is finished. The TFT is completed in this manner.

The example shown here is an example of forming a drive TFT (P-channel type TFT) for a pixel. By performing the above mentioned processes simultaneously, a large number of TFTs can be formed in a matrix, and an active matrix liquid crystal display device can be made.

Another application of this invention is a so-called three dimensional IC, having a TFT formed on a semiconductor integrated circuit after metal interconnections are formed. Of course, various kinds of applications can be performed other than that.

EMBODIMENT 3

This embodiment relates to a structure with a gate electrode mainly comprising metal. In this structure, metal composing a gate electrode (aluminum in this case) is prevented from diffusing into the gate insulating film and alloying there.

FIG. 3 shows a process of manufacturing a TFT according to this embodiment. A thin film 302 having a chemical formula of $SiO_xN_y$ is formed having a 1000 Å thickness on a glass substrate 301 by a plasma CVD method utilizing dichlorosilane. An amorphous silicon film 303 is formed having a 1000 Å thickness by a plasma CVD method or by a low pressure thermal CVD method.

Nickel acetate salt is then coated on the amorphous silicon film 303 by a spin coat method. This is to introduce nickel as a metal element promoting crystallization into the amorphous silicon film. Thermal treatment in an inert atmosphere at 550° C., for 4 hours is performed. The amorphous silicon film 303 is crystallized, and a crystalline silicon film is obtained. It is desirable that the concentration of nickel included in the crystalline silicon film be from $1\times10^{15}$ cm$^{-3}$ to $1\times10^{19}$ cm$^{-3}$. If the concentration of nickel is $1\times10^{15}$ cm$^{-3}$ or less, the effect of promoting crystallization is small, and if it is $1\times10^{19}$ cm$^{-3}$ or more, the semiconductor character of silicon is lost.

After the amorphous silicon film is crystallized and a crystalline silicon film is obtained, hydrogen ions are implanted. In this manner, hydrogen ions are implanted to the crystalline silicon film, and dangling bonds of silicon in the crystalline silicon film are neutralized by the implanted hydrogen. In order to include hydrogen ions in the crystalline silicon film, other than through implantation of hydrogen ions, it is possible to use a method wherein the sample is heated in a hydrogen atmosphere, or wherein the sample is exposed in a hydrogen atmosphere. By performing patterning, an active layer 304 of a TFT is formed. Implantation of hydrogen ions above mentioned could also be performed after formation of this active layer 304.

After the active layer 304 is formed, a thin film 305 having a chemical formula of $SiO_xN_y$ is formed as a gate insulating film. The $SiO_xN_y$ thin film 305 functions as a gate insulating film and changes its composition gradually. It is characteristic that deposition is performed with a composition as shown in FIG. 4.

Figure 4:
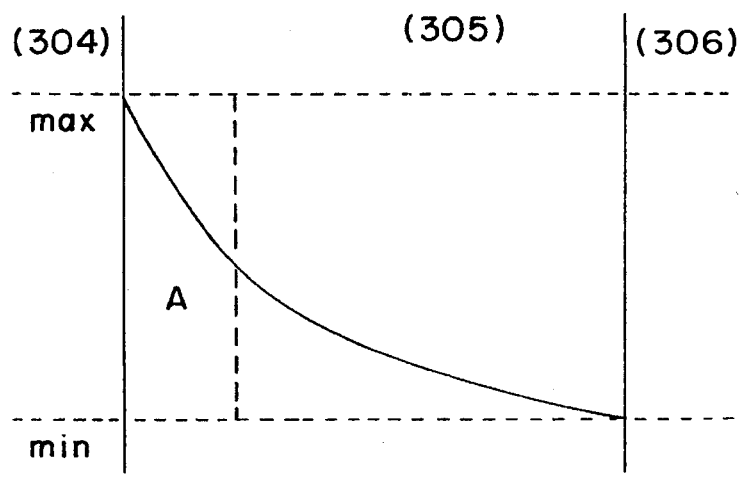
FIG. 4 a distribution of concentration of nitrogen in the gate insulating film in accordance with one embodiment of the present invention.

In FIG. 4, a position from the active layer to the gate electrode is shown on the horizontal axis, and the concentration of nitrogen (N) is shown on the vertical axis. In FIG. 4, the maximum value of the concentration is 0.1 atomic percent to 30 atomic percent; and the minimum value is 0.001 atomic percent to 3 atomic percent. This value represents the concentration of nitrogen atoms. To obtain a concentration as is shown in FIG. 4, $SiH_4$, $O_2$, and $NH_4$ are utilized as material gases, and the mixture ratio of $NH_4$ is controlled. That is, by gradually decreasing the mixture ratio of $NH_4$ during the procedure of deposition since the deposition of the $SiO_xN_y$ gate insulating film is started, the composition ratio of nitrogen as is shown in FIG. 4 is obtained. As a material gas, a silane system gas of a high order like $Si_2H_6$, $N_2O$ gas and the like can be utilized.

With the composition ratio of nitrogen as is shown in FIG. 4, a structure including nitrogen at a high concentration at the interface between the active layer and the gate insulating film, and at the gate insulating film near the interface is made. Bondings between silicon and nitrogen are minute and provide a high barrier effect. That is, a region expressed as "A" functions as a barrier preventing penetration of hydrogen ions and nickel ions from the active layer. In regions other than the region "A", because the concentration of nitrogen is low, charge trapping centers caused by Si clusters, which is a problem with silicon nitride films, can be decreased. Moreover, the $SiO_xN_y$ gate insulating film as a whole has significant advantages. That is, with adoption of the structure of this embodiment, the penetration of ions into the gate insulating film from the active layer is prevented in addition to the other advantages of the $SiO_xN_y$ film.

After the gate insulating film 305 is formed, a thin film mainly comprising aluminum is formed having a 5000 Å thickness. The thin film mainly comprising aluminum is patterned and a gate electrode 306 is formed. After the gate electrode 306 is formed, anodic oxidation is performed in an electrolyte with this gate electrode as an anode, and an anodic oxide layer 307 is formed. This oxide layer 307 is formed having approximately a 2000 Å thickness. Because this oxide layer 307 exists, an offset gate region can be formed during a later process of implanting impurity ions.

Figure 3A:
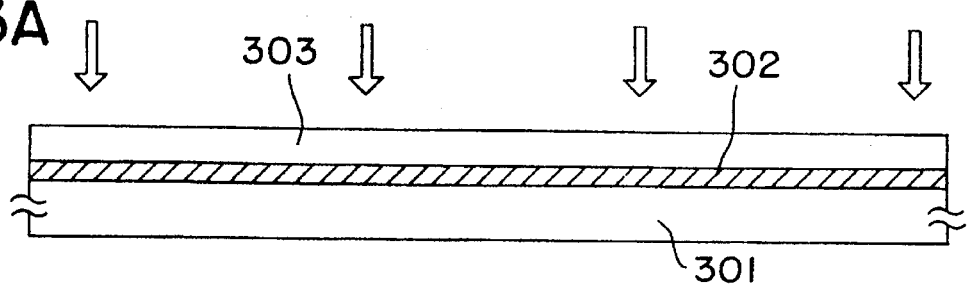
FIGS. 3A to 3D illustrate a manufacturing process of a TFT in accordance with a third embodiment of the present invention.
Figure 3B:
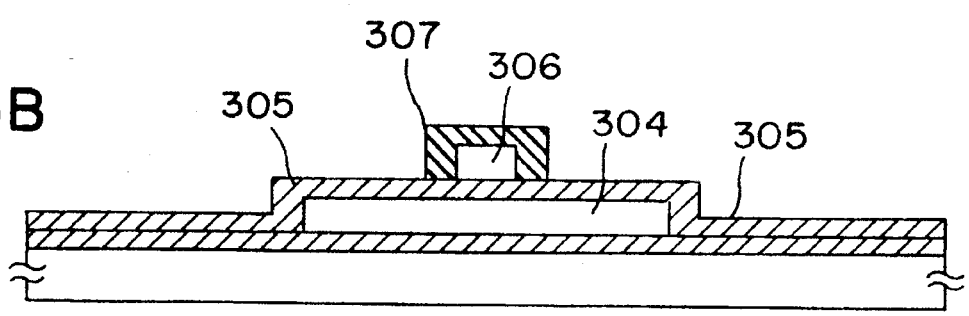
Figure 3C:
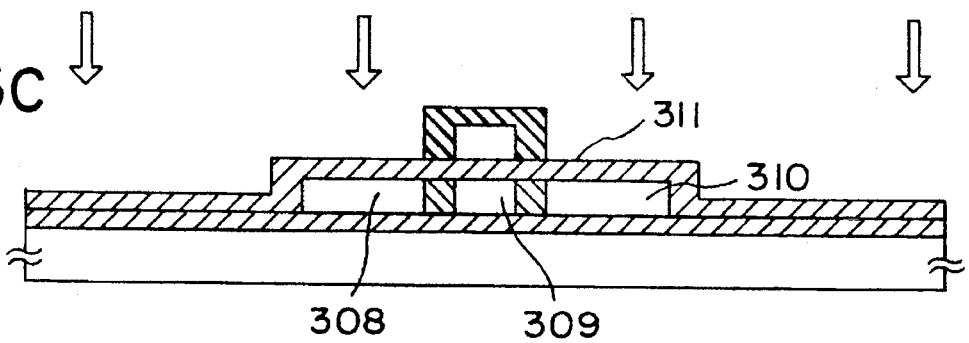
Figure 3D:
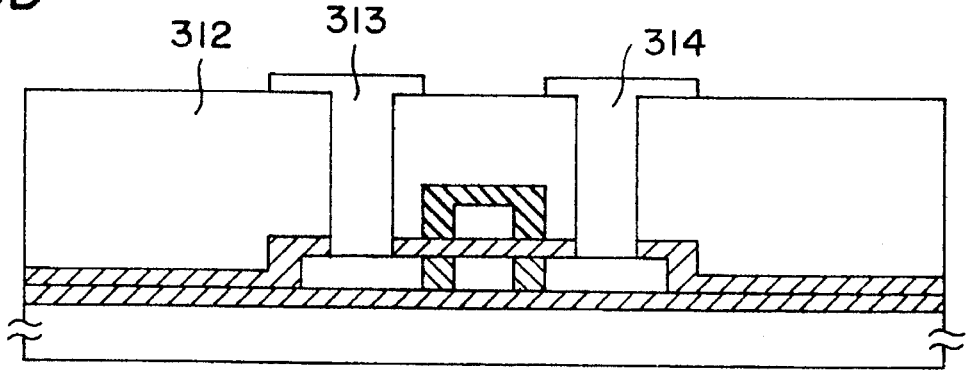

Next, impurity ions are implanted, and a source region 308, a drain region 310, and a channel formation region 309 are formed in a self-alignment manner. An offset gate region 311 is formed at the same time. To form an N-channel TFT, P (phosphorous) ions are implanted. After the implantation of impurity ions is finished, the source region 308 and the drain region 310 are activated by irradiating a laser light or strong light as illustrated in FIG. 3(C). The substrate can be heated at 400° to 700° C.

A silicon oxide film is formed as an interlayer insulator 312 by a plasma CVD method. By way of a process of hole-opening, a source electrode 313 and a drain electrode 314 are formed, and a TFT is formed. Because an active layer of the TFT shown in FIG. 3 will be covered with a thin film having a chemical formula $SiO_xN_y$, hydrogen or metal elements promoting crystallization will not diffuse out from the active layer.

Needless to say, the structure shown in this embodiment can be utilized for a gate insulating film discussed above in connection with embodiments 1 and 2.

EMBODIMENT 4

Figure 5:
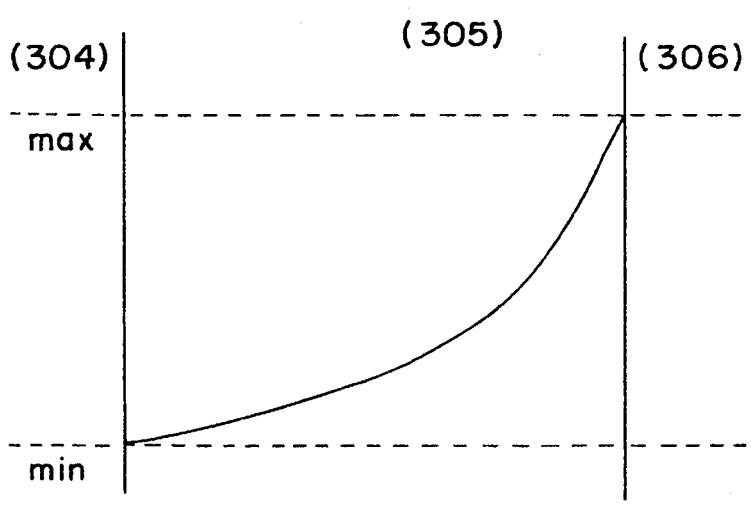
FIG. 5 illustrates a distribution of concentration of nitrogen in the gate insulating film in accordance with another embodiment of the present invention.

This embodiment is characterized in that the concentration of the gate insulating film 305 in the structure shown in embodiment 3 is made as illustrated in FIG. 5. FIG. 5 shows the concentration of nitrogen (N) in a $SiO_xN_y$ film composing a gate insulating film 305. That is, the ratio of nitrogen in the gate insulating film 305 gradually gets bigger from the side of the active layer 304 to the side of the gate electrode 306.

In FIG. 5, the maximum concentration is approximately 0.1 atomic percent to 30 atomic percent, preferably 1 atomic percent to 30 atomic percent, and the minimum value is 0.001 atomic percent to 3 atomic percent. This value can be controlled by changing the mixture ratio of the material gas of the nitrogen series (such as $NH_4$). By gradually changing this mixture ratio of nitrogen series gas, the ratio of nitrogen atoms can be gradually changed as is shown in FIG. 5.

If a structure shown in FIG. 5 is adopted, a barrier layer can be formed on the side of the gate electrode 306 in the gate insulating film 305. Thus it is possible to prevent material components included in the gate electrode from being diffused in the gate insulating film from the gate electrode. For example, it is possible to prevent aluminum composing the gate electrode from being diffused into the gate insulating film, and alloying with silicon atoms in the gate insulating film.

It is especially effective to adopt a structure shown in this embodiment in performing an activation process of source/drain regions by heating. That is, in the process of activating the source/drain regions, which is usually performed at 400° to 700° C., it is possible to prevent aluminum composing the gate electrode from diffusing into the gate insulating film, and to prevent aluminum composing the gate electrode from alloying with silicon existing in the gate insulating film.

EMBODIMENT 5

Figure 6:
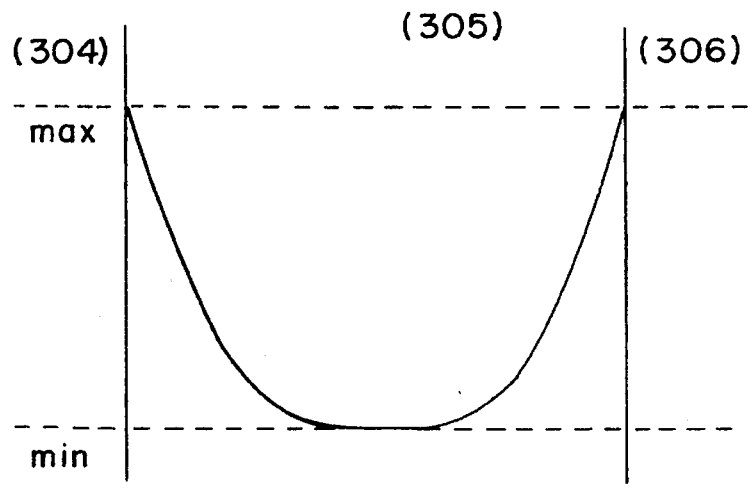
FIG. 6 illustrates the distribution of concentration of nitrogen in the gate insulating film accordance with a third embodiment of the present invention.

This embodiment is characterized in that the gate insulating film 305 of the structure shown in embodiment 3 has a concentration of N (nitrogen) as shown in FIG. 6. FIG. 6 shows the concentration of N (nitrogen) in a $SiO_xN_y$ film composing the gate insulating film 305. That is, the concentration of nitrogen in the gate insulating film 305 changes in the shape of a "U" from the side of the active layer 304 to the side of the gate electrode 306.

In FIG. 6, the maximum value of nitrogen concentration is approximately 3 atomic percent to 30 atomic percent, preferably 1 atomic percent to 30 atomic percent, and the minimum value is approximately 0.01 atomic percent to 3 atomic percent. This value can be controlled by changing the mixture ratio of the material gas of a nitrogen system (such as $NH_4$). To change the ratio of nitrogen atoms gradually in the shape of a "U" as is shown in FIG. 6, the mixture ratio of gas of nitrogen system should be gradually changed during the film deposition process.

If a structure shown in FIG. 6 is adopted, barrier layers can be formed in the gate insulating film 304, at the boundary between the side of the gate electrode 306 and the gate insulating film 304, and at the boundary between the side of the gate insulating film 304 and the gate insulating film 304. Therefore, it is possible to prevent the material component included in the gate electrode from diffusing into the gate insulating film from the gate electrode. It is also possible to prevent hydrogen ions and metal elements (such as Ni) used for promoting crystallization from diffusing into the gate insulating film.

By adopting the structure shown in FIG. 6, electrical stability of the gate insulating film can be improved, and characteristics of the TFT can be improved.

EMBODIMENT 6

FIG. 6 shows an example of the concentration of nitrogen (N) in the gate insulating film 305 of the TFT shown in FIG. 3 changing gradually (changing smoothly, being considered to change smoothly, or changing approximately smoothly) in the shape of a "U" from the boundary of the active layer to the boundary of the gate electrode. Even if the concentration of nitrogen does not gradually change but changes in a step by step fashion, the same effect as that of FIG. 6 can be obtained.

Figure 7:
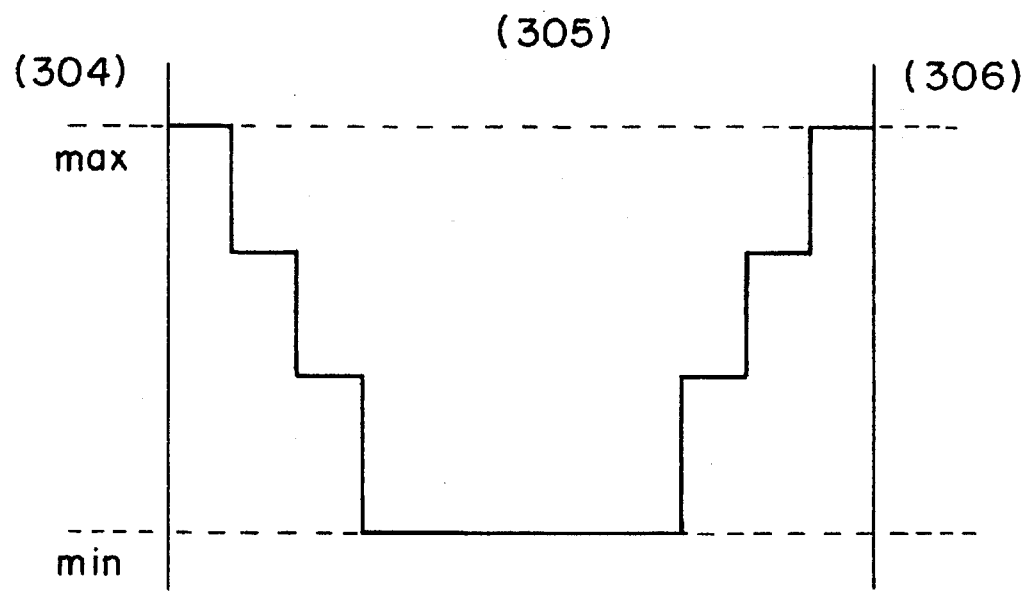
FIG. 7 illustrates the distribution of concentration of nitrogen in the gate insulating film in accordance with a fourth embodiment of the present invention.

FIG. 7 shows the concentration of nitrogen in the gate insulating film (a thin film having the chemical formula $SiO_xN_y$) of this embodiment. FIG. 7 shows an example of decreasing nitrogen concentration (i.e. composition ratio of nitrogen) in a step by step fashion (in this case, three steps) in the gate insulating film from the side of the active layer, and increasing nitrogen concentration (composition ratio of nitrogen) in a step by step fashion (in this case, three steps) in the direction of the side of the gate electrode. The maximum concentration value is approximately 3 atomic percent to 30 atomic percent, and the minimum value is approximately 0.01 atomic percent to 3 atomic percent.

To obtain the structure shown in FIG. 7, the number of times of deposition of the gate insulating film should be divided to match the number of steps desired, and the mixture ratio of material gas to be introduced should be controlled in each step.

With the structure shown in FIG. 7, the dielectric constant changes intermittently when the nitrogen concentration is changed in each step. Thus, a condition equivalent to that of multiple capacitors connected in series occurs, which can be a problem. That is, a condition equivalent to that of capacitors connected in series causes charge to accumulate in the gate electrode. (Therefore in this case, it is more preferable to change composition ratio continuously as is shown in FIG. 6.)

EMBODIMENT 7

Figure 8:
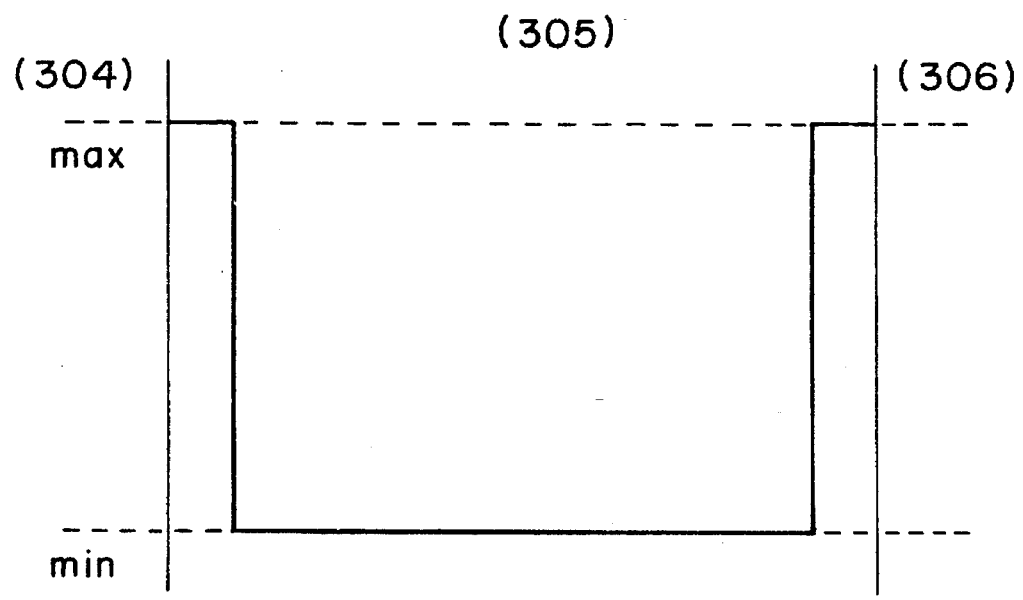
FIG. 8 illustrates the distribution of concentration of nitrogen in the gate insulating film in accordance with a fifth embodiment of the present invention.

This embodiment is a variation of the structure shown in FIG. 7, and is characterized in that concentration of nitrogen in the gate insulating film having a chemical formula of $SiO_xN_y$, is changed as shown in FIG. 8. The maximum concentration value is approximately 3 atomic percent to 30 atomic percent, and the minimum value is approximately 0.01 atomic percent to 3 atomic percent.

By making a gate insulating film of a TFT provided on an insulating substrate, especially on a glass substrate, having a chemical formula $SiO_xN_y$, the following advantages can be realized:

1. Electrostatic discharge damage of the gate electrode can be prevented.

2. SiN bonding can prevent drift of Na and heavy metal ions.

3. Because fixed charge will not exist in the film, hysteresis is not made in the C-V (capacitance-voltage) characteristic, and stable operation is expected.

By utilizing chlorosilane or dichlorosilane as material gas in the method of forming a $SiO_xN_y$ film, Cl (chlorine) can be added in the film, and impurity ions can be stabilized by the effect of this Cl. Further stabilizing effects can be obtained in addition to above mentioned effect.

In the gate insulating film including the $SiO_xN_y$ film, by making the concentration of N the highest in the interface with the active layer and/or the gate electrode, various kinds of ions or elements are prevented from diffusing into the gate insulating film from the active layer and/or the gate electrode.

I claim:

1. An insulated gate field effect semiconductor device wherein a gate insulating film comprises a material represented as $SiO_xN_y$, and a distribution of N is varied in a thickness direction thereof so that a composition ratio of N at an interface between the gate insulating film and a gate electrode is higher than a composition ratio of N in a bulk portion of said gate insulating film.

2. The semiconductor device of claim 1 wherein the insulated gate field effect semiconductor device is formed on an insulating substrate.

3. The semiconductor device of claim 1 wherein an energy band gap of the material represented as $SiO_xN_y$ is 5.3 to 7.0 eV, a dielectric constant is 4 to 6, and x and y satisfy $0<x<2$, $0<y<4/3$ respectively.

4. The semiconductor device of claim 1 wherein an active layer of the insulated gate field effect semiconductor device is formed on said gate insulating film.

5. An insulated gate field effect semiconductor device wherein a gate insulating film comprises a material represented as $SiO_xN_y$ added with chlorine, and a distribution of N is varied in a thickness direction thereof.

6. The semiconductor device of claim 5 wherein an energy band gap of the material represented as $SiO_xN_y$ is 5.3 to 7.0 eV, a dielectric constant is 4 to 6, and x and y satisfy $0<x<2$, $0<y<4/3$ respectively.

7. A semiconductor device wherein a gate insulating film is constituted by a thin film represented as $SiO_xN_y$, and a composition ratio of N varies in a thickness direction of said gate insulating film and is higher at an interface between said gate insulating layer and a gate electrode and at an interface between said gate insulating film and an active layer.

8. The semiconductor device of claim 7 wherein a metal element for promoting crystallization of silicon is included in the active layer.

9. The semiconductor device of claim 8 wherein the metal element is an element of penetration type to silicon.

10. The semiconductor device of claim 8 wherein one or more elements selected from the group consisting of Ni, Fe, Co, Ru, Pd, Os, Ir, Pt, Cu, Ag, and Au are utilized as the metal element.

11. The semiconductor device of claim 1 wherein an active layer of said semiconductor device comprises silicon and contains hydrogen.

12. The semiconductor device of claim 5 wherein an active layer of said semiconductor device comprises silicon and contains hydrogen.

13. The semiconductor device of claim 7 wherein said active layer of said semiconductor device comprises silicon and contains hydrogen.

14. An insulated gate field effect semiconductor device wherein a gate insulating film comprises a material represented as $SiO_xN_y$, and a distribution of N is varied in a thickness direction thereof, wherein a metal element for promoting crystallization of silicon is included in an active layer of said device, said metal element selected from the group consisting of Ni, Fe, Co, Ru, Pd, Os, Ir, Pt, Cu, Ag, and Au.

15. The semiconductor device of claim 14 wherein the insulated gate field effect semiconductor device is formed on an insulating substrate.

16. The semiconductor device of claim 14 wherein an energy band gap of the material represented as $SiO_xN_y$ is 5.3 to 7.0 eV, a dielectric constant is 4 to 6, and x and y satisfy $0<x<2$, $0<y<4/3$ respectively.

17. The semiconductor device of claim 14 wherein an active layer of the insulated gate field effect semiconductor device is formed on said gate insulating film.

18. The semiconductor device of claim 14 wherein an active layer of said semiconductor device comprises silicon and contains hydrogen.

* * * * *